(12) United States Patent
McConnell et al.

(10) Patent No.: US 8,331,078 B2
(45) Date of Patent: Dec. 11, 2012

(54) LEADED MULTI-LAYER CERAMIC CAPACITOR WITH LOW ESL AND LOW ESR

(75) Inventors: John E. McConnell, Pelzer, SC (US);
Reggie Phillips, Fountain Inn, SC (US);
Alan P. Webster, Mauldin, SC (US);
John Bultitude, Greenville, SC (US);
Mark R. Laps, Simpsonville, SC (US);
Lonnie G. Jones, Greenville, SC (US);
Garry Renner, Easley, SC (US)

(73) Assignee: Kemet Electronics Corporation, Greenville, SC (US)

( * ) Notice: Subject to any disclaimer, the term of this patent is extended or adjusted under 35 U.S.C. 154(b) by 332 days.

(21) Appl. No.: 12/732,549

(22) Filed: Mar. 26, 2010

(65) Prior Publication Data
US 2010/0243307 A1 Sep. 30, 2010

Related U.S. Application Data

(60) Provisional application No. 61/163,496, filed on Mar. 26, 2009.

(51) Int. Cl.
*H01G 4/228* (2006.01)
(52) U.S. Cl. ............. 361/306.3; 361/306.1; 361/303; 361/305; 361/321.2; 361/321.1
(58) Field of Classification Search ........ 361/306.3, 361/306.1, 303–305, 311–313, 321.2, 321.4
See application file for complete search history.

(56) References Cited

U.S. PATENT DOCUMENTS

| | | | |
|---|---|---|---|
| 6,081,416 A | 6/2000 | Trinh et al. | |
| 6,233,134 B1 * | 5/2001 | Sakamoto et al. | 361/311 |
| 6,301,759 B1 | 10/2001 | Langer et al. | |
| 6,523,235 B1 | 2/2003 | Ishigaki et al. | |
| 7,397,649 B2 * | 7/2008 | Muto et al. | 361/321.4 |
| 7,751,178 B2 * | 7/2010 | Suzuki | 361/321.4 |
| 8,164,880 B2 * | 4/2012 | Kang et al. | 361/321.4 |

FOREIGN PATENT DOCUMENTS
EP 0929087 A2 7/1999

OTHER PUBLICATIONS

PCT International Search Report; Int. Application No. PCT/US2010/028800; Oct. 2010; Author: Park, Roh Choon.
Wolfgang Korb, Supplemental European Search Report, EP 10 75 6898; Jul. 13, 2012.

* cited by examiner

*Primary Examiner* — Nguyen T Ha
(74) *Attorney, Agent, or Firm* — Joseph T. Guy; Nexsen Pruet, LLC

(57) ABSTRACT

A multi-layered ceramic capacitor with at least one chip and with first base metal plates in a parallel spaced apart relationship and second base metal plates in a parallel spaced apart relationship wherein the first plates and second plates are interleaved. A dielectric is between the first base metal plates and said second base metal plates and the dielectric has a first coefficient of thermal expansion. A first termination is in electrical contact with the first plates and a second termination is in electrical contact with the second plates. Lead frames are attached to, and in electrical contact with, the terminations wherein the lead frames have a second coefficient of thermal expansion and the second coefficient of thermal expansion is higher than said first coefficient of thermal expansion. The lead frame is a non-ferrous material.

30 Claims, 11 Drawing Sheets

LEADED MULTI-LAYER CERAMIC CAPACITOR WITH LOW ESL AND LOW ESR

CROSS-REFERENCE TO RELATED APPLICATIONS

The present application claims priority to pending U.S. Provisional Application No. 61/163,496 filed Mar. 26, 2009 which is incorporated herein by reference.

BACKGROUND OF INVENTION

The present invention is related to the use of non-ferrous alloys as lead frame materials in Multi-Layer Ceramic Capacitors.

As the trend to reduce the size of electronic devices continues, the need to increase the electrical performance, mechanical robustness, and improve the efficiencies of each component becomes more critical. The performance and efficiencies of capacitors is no less important than many of the more active devices. Not only do the inefficiencies of the capacitor affect the performance of the circuits, they also affect the thermal management problem that is created by the increased generation of heat due to the applied voltage and current. The continued desire to decrease the size of electronic devices places an ever increasing pressure on component manufacturers to minimize the size of components while maintaining or increasing performance.

Multi-Layer Ceramic Capacitors (MLCC), which are the focus of this invention, are under significant pressure to minimize size due to their widespread use and superior performance when compared to many other types of capacitor.

The relationship between capacitance, electrode overlap and active thickness is given in Equation 1.

$$C = \epsilon_0 \epsilon_r A N / t \quad \text{Equation 1}$$

where:
C=Capacitance (F);
$\epsilon_0$ is a constant which is the Permittivity of Free Space=8.854×10$^{-12}$ (F/m);
$\epsilon_r$=dielectric permittivity;
A=overlap area of active electrodes (m$^2$);
N=number of actives; and
t=Active thickness (m).

It can be seen from Equation 1 that for any given dielectric, with a characteristic dielectric permittivity, capacitance can be raised by increasing the area (A), reducing the active thickness (t), increasing the number of layers (N) or some combination thereof.

Increasing the overlap area of the capacitor can generally be achieved by increasing the length and width of the capacitor which necessarily increases the pad size area required to mount the capacitor. This is contrary to efforts related to miniaturization.

Decreasing the active thickness, t, is limited by practical considerations such as the dielectric breakdown withstanding voltage of the dielectric as well as the production process used. Therefore, the voltage rating for the MLCC is lowered with reduced thickness which is undesirable.

Increasing the number of layers raises the thickness of the final part in the vertical dimension which is undesirable. Furthermore, there is an economical limit with regards to the number of layers that can be added to the capacitor in the vertical axis. It can become more economical to consider stacking two or more capacitors together that are electrically connected through the use of a lead frame. There are also applications where it is desirable to attach leads to a single chip to reduce tensile stresses on the MLCC during substrate flexing. Typically, single chips are mounted directly to the board, a process known to the industry as "surface mount".

When selecting high performance capacitors it is necessary to identify those that provide the optimum electrical performance for the application. Low ESR and low ESL are desirable because under an electrical load the conversion of electrical energy to heat is minimized resulting in the lowest power loss. In MLCC's the dielectric material is an important factor. Ferroelectric class 2 materials such as X7R and X5R (EIA designation) have high dielectric constants and contain domains that move when an AC voltage is applied. This results in domain wall heat loss and is an additional source of concern compared to class 1 C0G dielectrics that are paraelectric with no domains. The class 1 type materials have far lower dielectric constants so for many applications the designer must use a class 2 dielectric to achieve the desired capacitance. By stacking more than one capacitor in a lead frame, as shown in FIG. 1, the capacitance can be doubled whilst using the same circuit board pad size. The lead frame, and connection thereto, has been a limiting component of stacked capacitors and a source of the inefficiencies in this approach.

Ceramic capacitors are one type of many capacitor designs available to designers. One physical property of ceramic capacitors is that they are extremely strong when subjected to compressive stresses but relatively weak under tensile loading. This becomes an important physical trait that designers must contend with when capacitors are attached to non rigid substrates such as typical laminate circuit boards made from a composite of fiberglass and epoxy, commonly known in the industry as FR-4, G-10, and CEM 1-4 series, etc. When ceramic capacitors are mounted to these non rigid substrates the forces induced into the ceramic, during board flexure, are critical and may cause the capacitors to crack or break due to the tensile forces induced into the capacitor body.

One design option available to minimize the stress induced into the ceramic capacitors body due to the flexing of the substrate is to add leads to the capacitor that actually absorb the flexure of the substrate thus minimizing the tensile stresses induced to the body of the ceramic capacitor. These leads are made from a conductive material with surface finishes that are compatible with the capacitor's terminations and the material used to attach the lead to the capacitor terminations generally referred to in the industry as solder, which can be of a Sn/Pb based alloy, or Lead (Pb) free solders, such as the Sn/Ag/Cu(SAC) alloys, or other alloys that provide acceptable processing for lead attach processes.

When considering the lead frame material, it has been taught in the art that materials with Coefficients of Thermal Expansion (CTE) that are ideally less than the ceramic must be used so that when the device is exposed to temperature cycling, the capacitor is always in a state of compression. Several preferred alloys exist that fit these physical properties. Such alloys common to the industry are the Ni/Fe alloys known as Alloy 42 which consists of approximately 42% Ni 58% Fe. Kovar® which consist of nickel, iron and cobalt is another common choice. Alloy 42 is the preferred material since it's is more economical than the Kovar® alloys. U.S. Pat. Nos. 6,310,759 and 6,523,235 describe the preference of using Alloy 42 due to its lower CTE than ceramic. U.S. Pat. No. 6,081,416 states that the CTE of ceramic needs to be 25% greater than the lead frame. These patents also identify the importance for components to be able to operate in temperature range of −55° C. to +150° C., an accepted industry standard for electronics, although some variations to this standard exist, such as −55 C to +125 C, or −40 C to +150 C, depending on the specific product application.

While the Ni/Fe alloys offer favorable mechanical properties their magnetic properties as well as low electrical conductivity are inherent electrical disadvantages. Both the lower conductivity and magnetic properties of the materials are detrimental to optimization of capacitor performance.

As realized from the foregoing there has been an ever increasing need to improve capacitor performance. Such an improvement is provided herein.

SUMMARY OF THE INVENTION

It is an object of the invention to provide an improved MLCC.

More specifically, it is an object of the invention to provide an MLCC with lower ESL and lower ESR.

A particular advantage of the present invention is the ability to provide more capacitance, with overall improved electrical characteristics, without an increase in the area required for mounting the capacitor.

These and other advantages, as will be realized, are provided in a multi-layered ceramic capacitor. The capacitor has at least one chip with first base metal plates in a parallel spaced apart relationship and second base metal plates in a parallel spaced apart relationship wherein the first plates and second plates are interleaved. A dielectric is between the first base metal plates and said second base metal plates A first termination is in electrical contact with the first plates and a second termination is in electrical contact with the second plates form a multi-layered ceramic capacitor having a first coefficient of thermal expansion. Lead frames are attached to, and in electrical contact with, the terminations wherein the lead frames have a second coefficient of thermal expansion and the second coefficient of thermal expansion is higher than said first coefficient of thermal expansion. The lead frame is a non-ferrous material.

DETAILED DESCRIPTION OF THE INVENTION

The present invention is related to an improvement in MLCC's and, particularly, leaded base metal electrode (BME) MLCC's. More specifically, the present invention is specific to the use non-ferrous lead frame material, which does not contain iron or nickel, on a base metal MLCC.

This invention utilizes non-ferrous alloys, preferably phosphor bronze, as a performance enhancing lead frame material that enables leaded BME capacitors to operate more efficiently, at higher power levels, with increased capacitance densities and in harsher environments, while providing mechanical robustness to meet the ever demanding design and environmental requirements of modern electronic products. The capacitor structure, and electronic improvements, is in direct contradiction to the expectations in the art.

Figure 1:
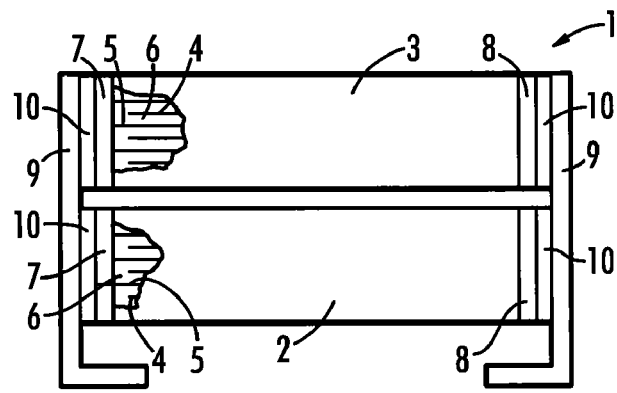
FIG. 1 is a partial cut-away side schematic view of a leaded MLCC capacitor.

A leaded BME MLCC stacked capacitor is illustrated in FIG. 1. In FIG. 1 the leaded BME MLCC stacked capacitor, 1, comprises a 2 chip stack with a lower chip, 2, and an upper chip, 3, with "lower" an "upper" being relative terms used for convenience of discussion without limit thereto. Each chip has alternating base metal electrode (BME) plates terminating at opposing end terminals. First base metal plates, 4, terminate at termination, 8, of one polarity and second base metal plates, 5, terminate at the opposite termination 7, of opposing polarity. The chips are attached to lead frames, 9, by solder or conductive adhesive, 10. The leaded BME MLCC stacked capacitor can comprise at least one MLCC or a plurality of MLCC's stacked on top of one another. The number of MLCC's in a stack may be up to 200 with 2-20 being optimum. Multiple stacks, such as 1-50 chips per stack, or more preferably 2-10 chips per stack, can be arranged in-line and contained within the same lead frame.

The plates are base metal electrode plates. A particularly preferred plate comprises nickel with a plate consisting essentially of nickel being most preferred.

Figure 1A:
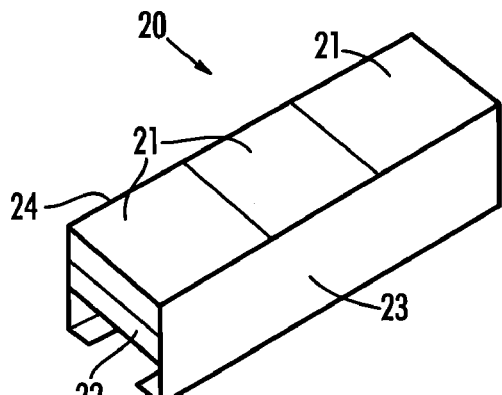
FIG. 1A is a perspective schematic view of a leaded MLCC capacitor.

Another embodiment is illustrated in FIG. 1A. In FIG. 1A the leaded MLCC capacitor, 20, comprises six chips arranged in a 2×3 orientation with three upper chips, 21, and three lower chips, 22, between lead frames 23 and 24.

Figure 1B:
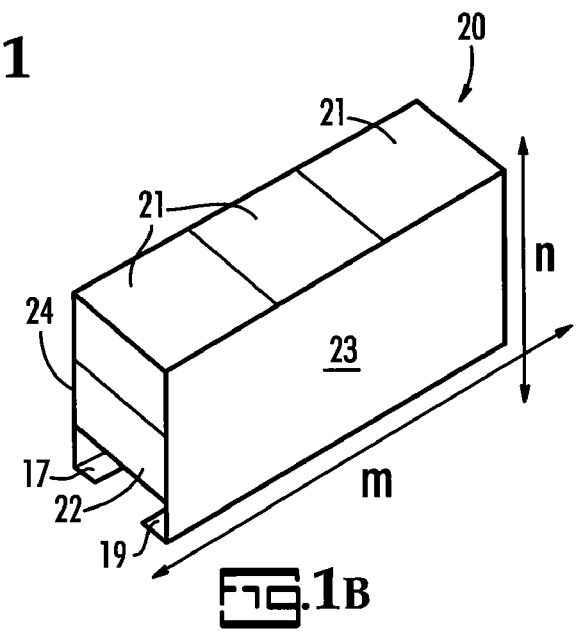
FIG. 1B is a perspective schematic view of an embodiment of the invention.

FIG. 1B illustrates an embodiment of the invention wherein the nomenclature used herein is described. The direction perpendicular to the surface upon which the capacitor is mounted, such as by feet, 19, is designated "n" and referred to as a stack. The number of stacks is designated "m". A multi-chip capacitor is therefore referred to as an "n×m array". For the purposes of illustration FIG. 1B illustrates a 2×3 array.

Figure 1C:
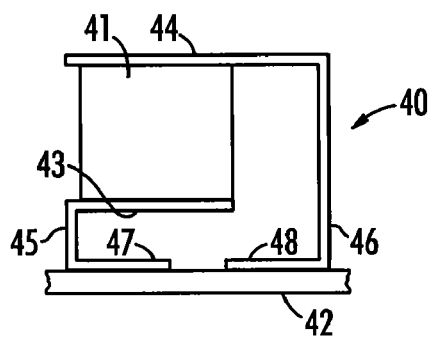
FIG. 1C is a side schematic view of an embodiment of the invention.
Figure 1D:
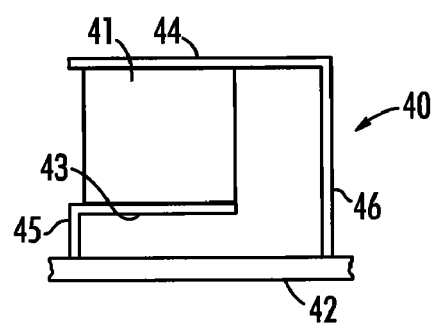
FIG. 1D is a side schematic view of an embodiment of the invention.

FIG. 1C illustrates an embodiment of the invention. In FIG. 1C the capacitor, 40, comprises a 1×m array with chips, 41, arranged with the internal plates perpendicular to the substrate, 42. A first lead, 43, is mounted to the array on the surface closest to the substrate and the second lead, 44, is mounted to the surface furthest from the substrate. The lead frame arms, 45 & 46, may be a through lead, as illustrated in FIG. 1D, or formed to create a lead foot, 47 & 48, for surface mounting.

The lead frame may be adhered to the MLCC either by the use of conductive epoxies, solders, or other electrical conductive joining technologies. In this case a lead free solder alloy is preferred. A particularly preferred solder alloy comprises about 91-92 wt % Sn and about 8-9 wt % Sb and more preferably about 91.5% Sn and about 8.5% Sb. Pb/Sn solders can also be used but it is preferred by the industry to move away from Pb bearing solders. The preferred lead frame material for this application is a phosphor bronze material having the bulk material being copper and the balance being zinc, tin, and phosphorus.

The electrical performance of MLCC capacitors has been improved while maintaining or improving the mechanical robustness. The preferred lead frame materials are phosphor bronze, brass, copper, and copper alloys all of which exclude Ni and Fe materials. These materials have been considered improper for use in an MLCC applications due to there high CTE which would be expected to provide a component which is fragile to heat variations.

Phosphor bronze generally consists of a bulk material being about 80+% copper with zinc, tin, and phosphorus making up the balance of the alloy. These materials all have higher electrical conductivity than the Ni/Fe alloys and are also non-magnetic and provide a reduced ESL and ESR. Copper based alloys, such as Alloy 194, are commonly used in the electronics industry for lead frame materials where cost and electrical conductivity, and compatibility to assembly processes are important. Beryllium Copper (BeCu) alloy is also widely used in semi-conductor lead attach because of its superior compliancy. Due to their high CTE none of the materials have been considered preferable as a lead frame component in MLCC.

Typical ceramic dielectrics have a CTE of about $8 \times 10^{-6}$ to about $12 \times 10^{-6}$ μm/m·° C. with barium titanate being about $10 \times 10^{-6}$ μm/m·° C. When incorporated in a multilayer capacitor with terminations the resulting CTE range of these composites is typically increased to $6 \times 10^{-6}$ μm/m·° C. to $14 \times 10^{-6}$ μm/m·° C. Alloy 42 is referred to in the art as a preferred lead frame material due to the CTE of about $5.3 \times 10^{-6}$ μm/m·° C. Phosphor bronze has a CTE of about $17.8 \times 10^{-6}$ μm/m·° C. Beryllium copper alloy has a CTE of about $16.7 \times 10^{-6}$ μm/m·° C. Alloy 194 has a CTE of about $16.3 \times 10^{-6}$ μm/m·° C. It is considered contrary to the art to utilize a lead material with a CTE which is higher than that of the MLCC. In direct contrast the preferred CTE is at least $2 \times 10^{-6}$ μm/m·° C. higher than the CTE for the MLCC for the present invention. Even more preferably, the CTE is at least $4 \times 10^{-6}$ μm/m·° C. higher than the CTE for the ceramic for the present invention. This is in direct contrast to the teachings in the art which require the CTE of the lead frame to be lower, and preferably much lower, than the CTE of the ceramic.

Figure 2:
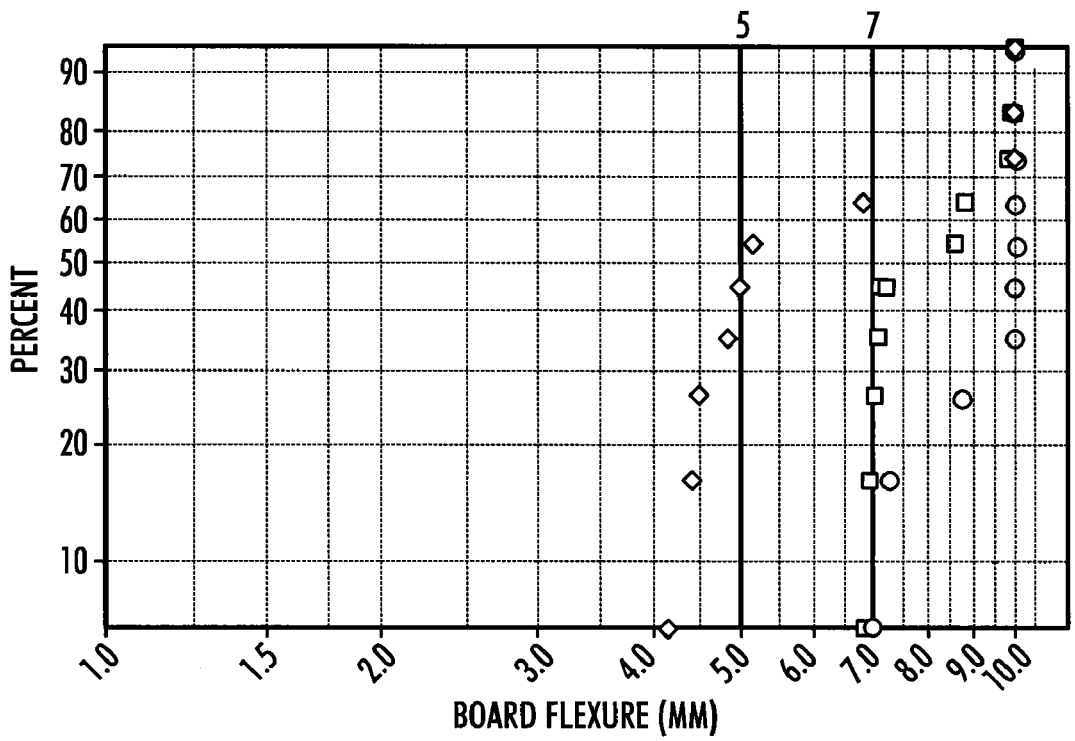
FIG. 2 graphically illustrates board flexure data.

Board flexure tests of 2220 case size, X7R MLCC's 22 μF 50V capacitors with nickel electrodes were soldered by the same material and method into lead frames, 2 per frame, made of these different alloys were conducted with the results shown in FIG. 2. In all of these cases failures were recorded when capacitance was lowered by 2% on flexing on a standard FR-4 circuit board base on AEC Q-200 methodology. FIG. 2 shows a Weibull plot of the percentage of these failures in a 30 piece sample compared to the distance the board was flexed. Phosphor bronze (○) was chosen as the preferred lead frame material based on the board flexure test results. Phosphor bronze improves the electrical performance of the capacitor. The test data also shows that phosphor bronze provides excellent mechanical robustness which is contrary to the expectations in the art. FIG. 2 also illustrates the flexure comparison of two different non-ferrous alloys, specifically, CU 194 (◇) and BeCu (□). This comparison illustrates the superior board flexure achieved when phosphor bronze is utilized as a lead frame material. Another observation is that both the BeCu and Cu194 offer improved flexure capabilities when compared to direct surface mount or Flex Term technologies. The data of FIG. 2 demonstrates the effects of different lead frame alloys on the amount of board flexure a component can withstand. Phosphor Bronze clearly demonstrates its superior flexure capability.

Figure 3:
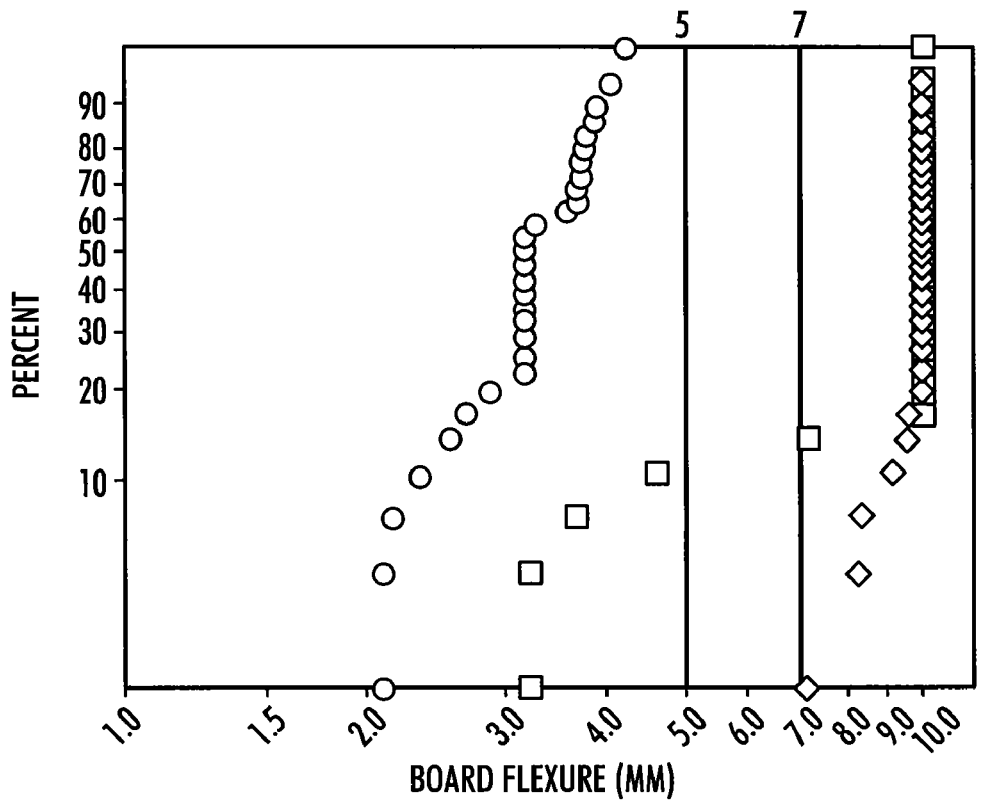
FIG. 3 graphically illustrates board flexure data.

FIG. 3 illustrates a comparison of three capacitors prepared as indicated relative to FIG. 2. One capacitor is a surface mount device (○) with no lead frame. A second capacitor utilizes Kemet's FT Cap termination (□) which is a flexible polymer termination as disclosed in CARTS USA 2009 Proceedings, March 2009, Jacksoville Fla. "Flexible Termination—Reliability in Stringent Environments". The third capacitor utilizes a phosphor bronze lead frame (◇) of this invention. Board Flexure comparative data is provided comparing standard surface mount MLCC's, MLCC's mounted with a Phosphor Bronze Lead Frame and the same MLCC design using a compliant polymer termination. Superior performance is observed for the phosphor bronze lead frame.

Figure 7A:
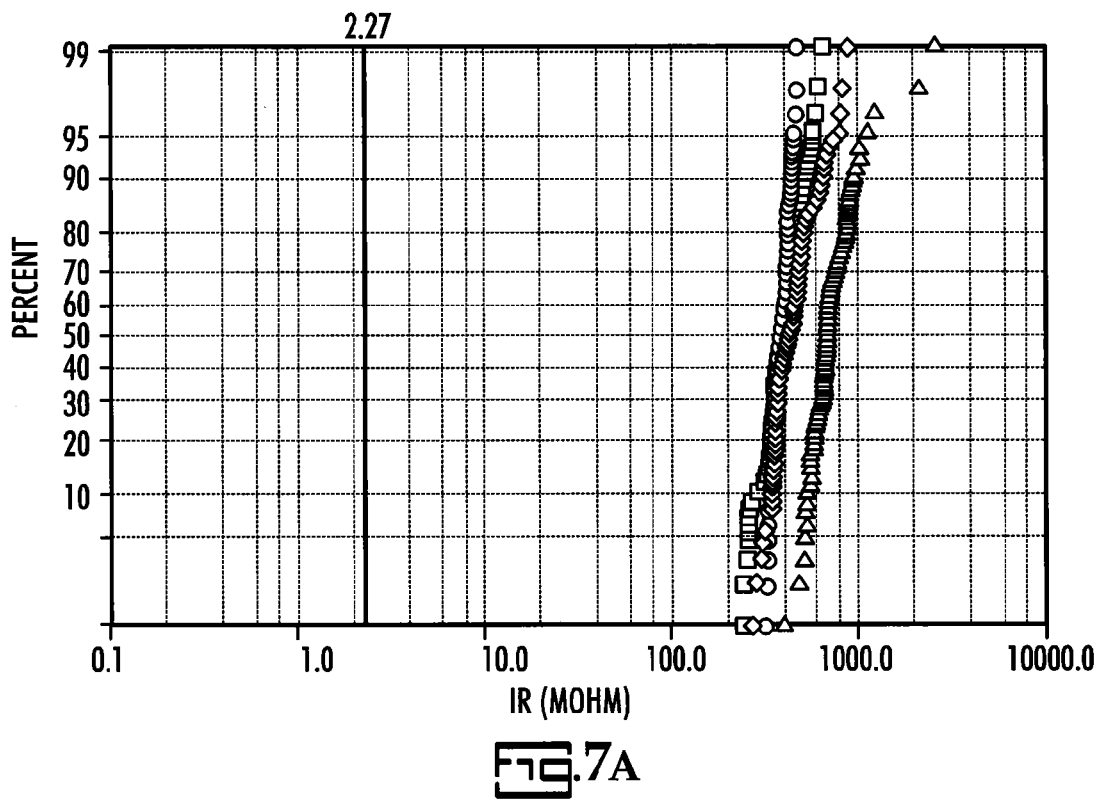
FIGS. 7a-7i graphically illustrate reliability test results for a 2-chip, 22 µF, 50V rated capacitor of this invention.
Figure 7B:
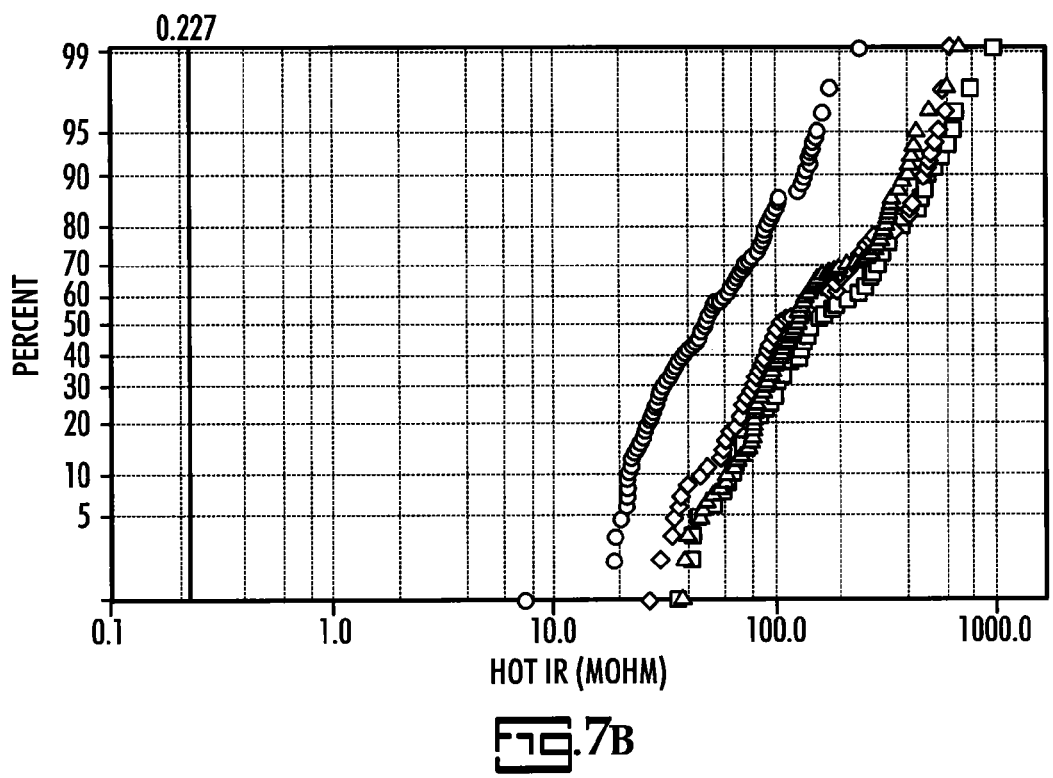
Figure 7C:
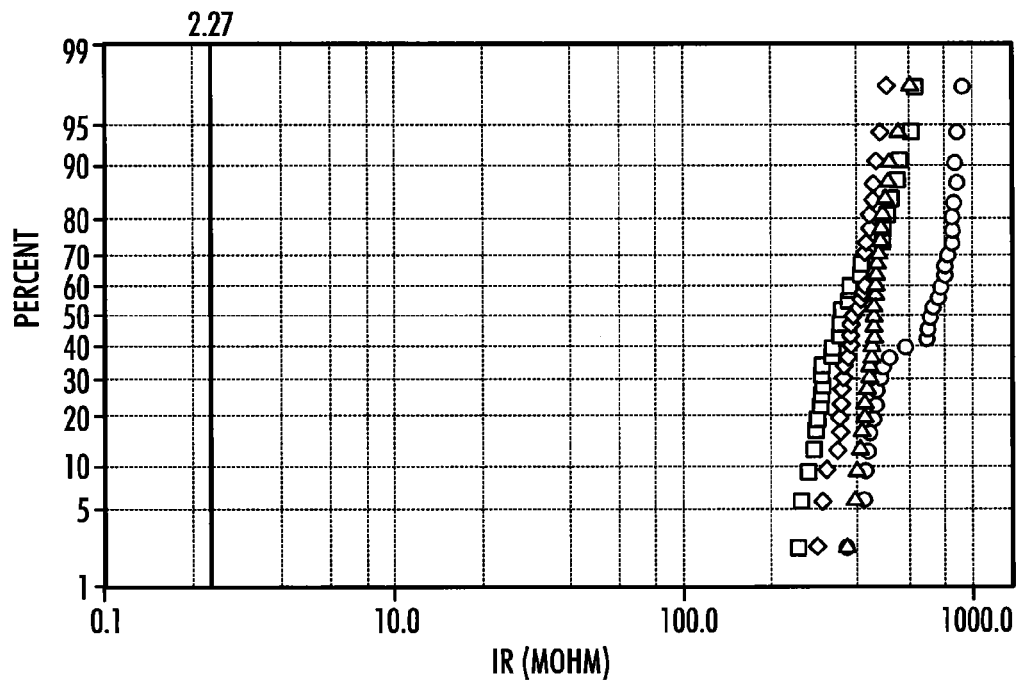
Figure 7D:
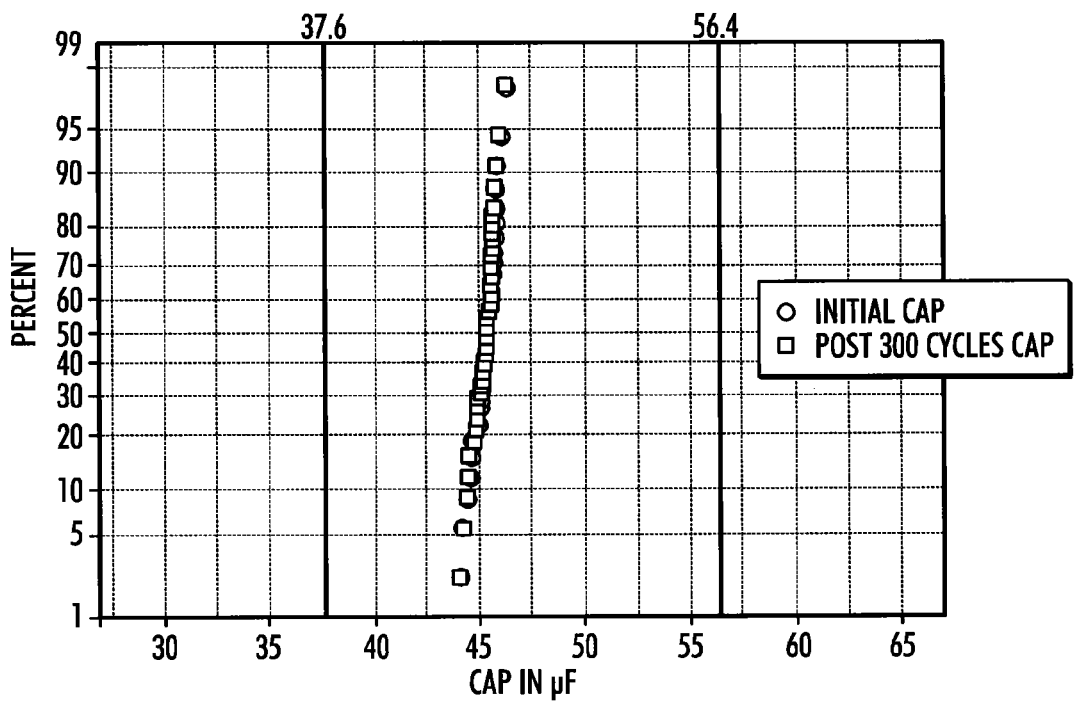
Figure 7E:
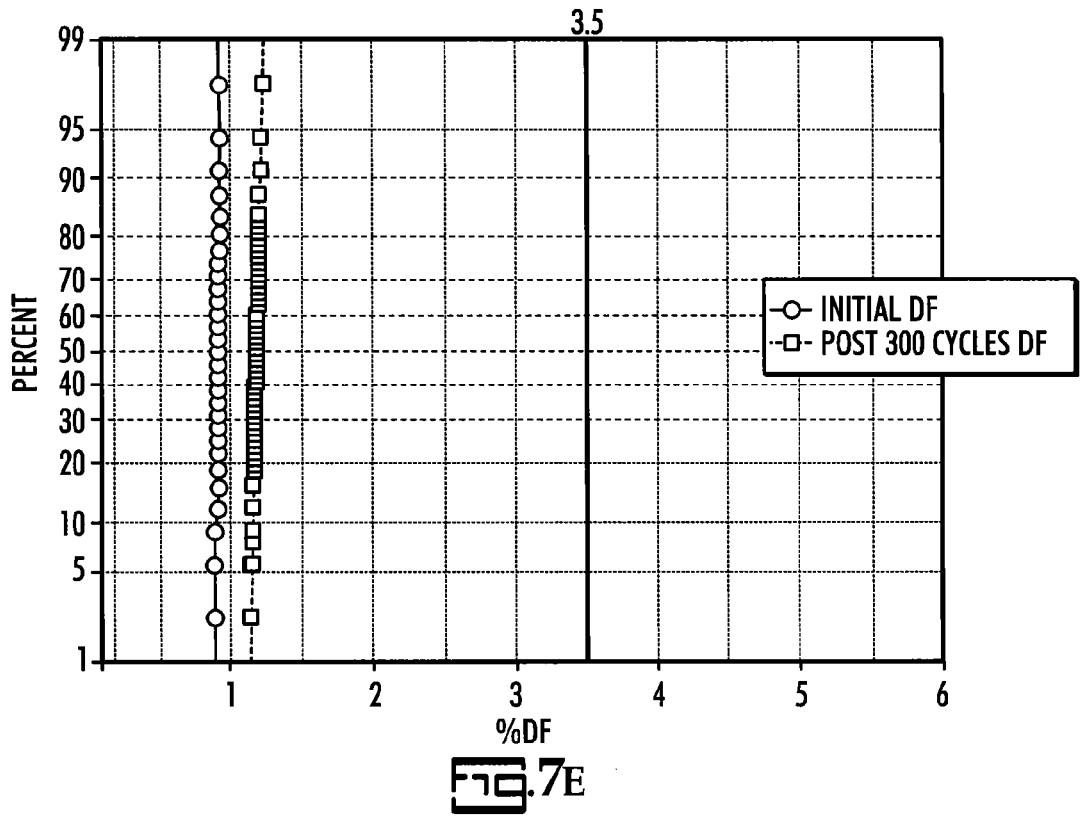
Figure 7F:
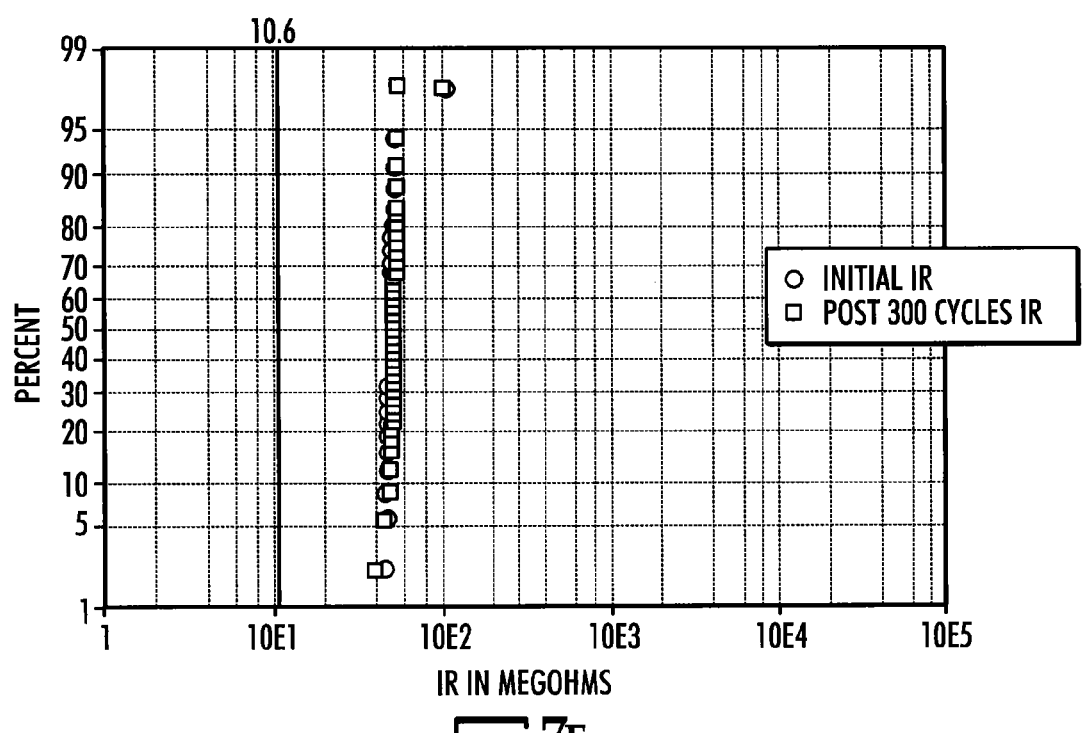
Figure 7G:
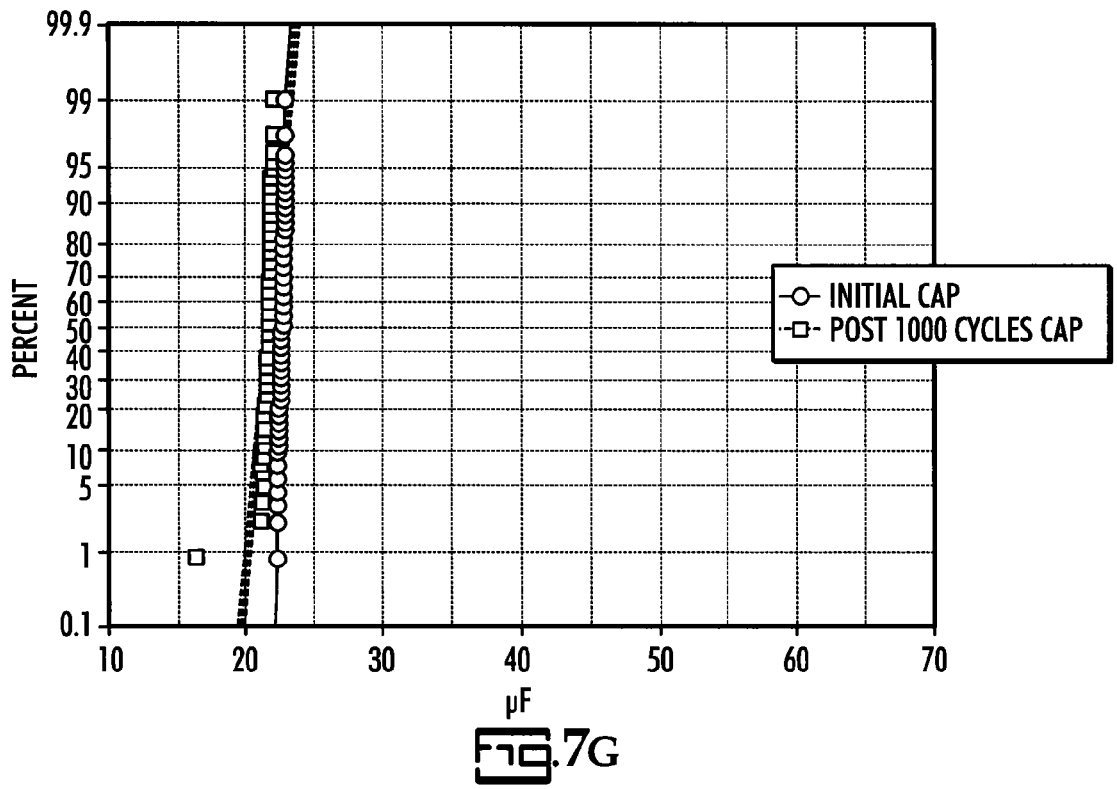
Figure 7H:
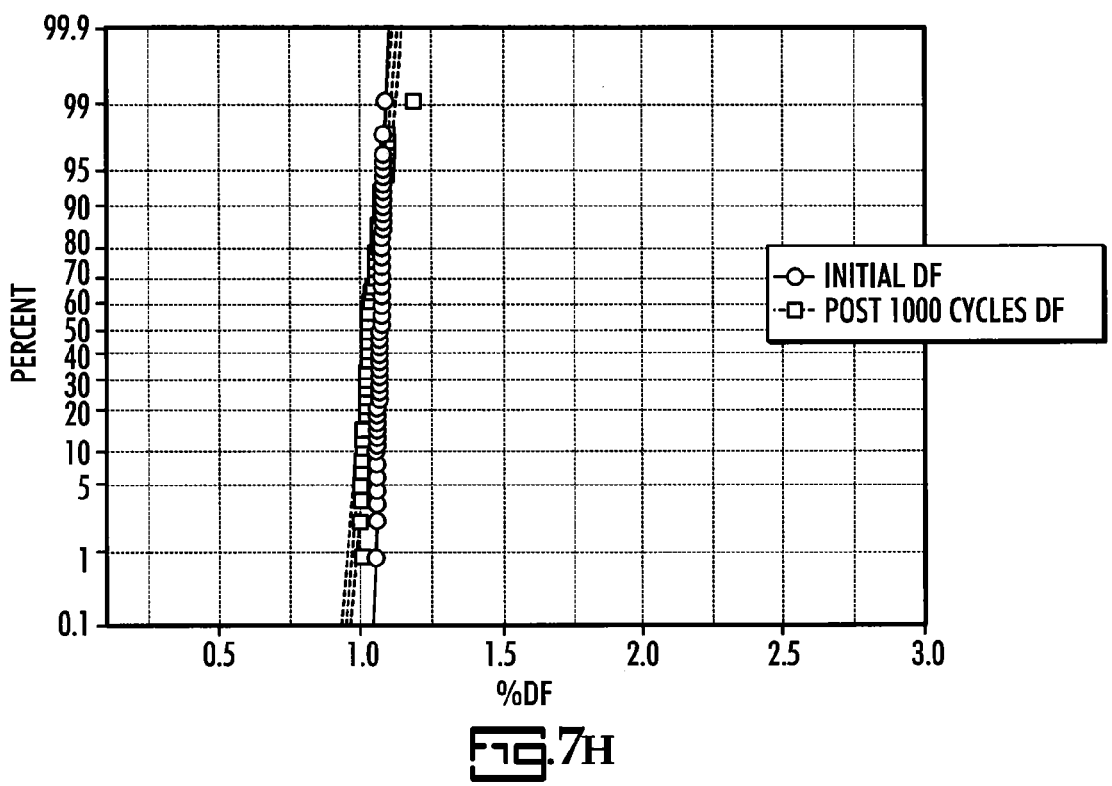
Figure 7I:
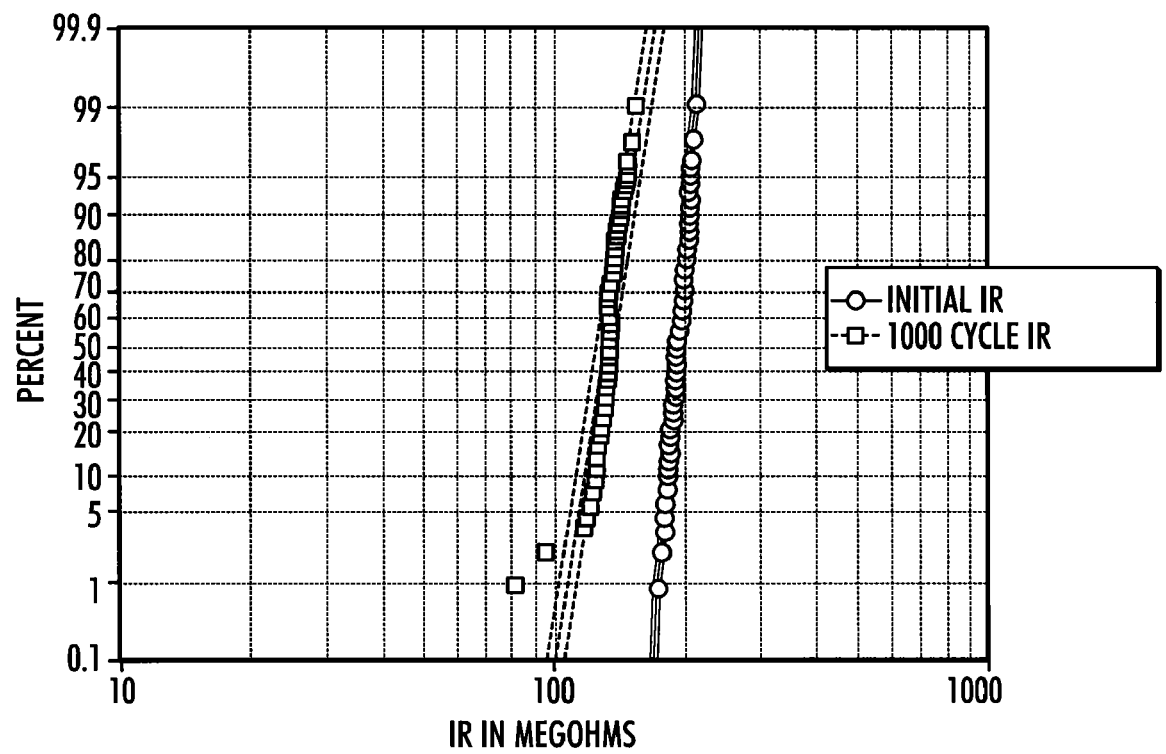

FIGS. 7a, 7b, and 7c, illustrate the robustness of a leaded base metal electrode MLCC capacitor with a phosphor bronze lead frame when subjected to long term environmental testing of 1000 hours at elevated temperatures. FIG. 7a shows acceptable cold (ambient) IR (insulation resistance), at various time intervals up to 1000 hrs after applying 2× rated voltage, 100V at 125° C. to 100 samples. FIG. 7b illustrates acceptable hot (125° C.) IR after the same test conditions as FIG. 7a. FIG. 7c shows acceptable cold IR after testing 100 samples at 85° C. and 85% relative humidity at rated voltage, 50V, for up to 1000 hours. FIGS. 7d,7e and 7f illustrate the excellent electrical performance, with acceptable capacitance, dissipation factor (DF) and IR respectively after Thermal Shock testing of 30 samples for 300 cycles from −55° C. to +150° C. with a transition time of less than 20 seconds between these temperatures. FIGS. 7g, 7h, and 7i demonstrate excellent performance, acceptable capacitance, DF and IR respectively after Thermal Cycling of 100 samples for 1000 cycles from −55° C. to +150° C. at 15° C./min temperature ramp with a 30 minute dwell at each temperature. These results clearly demonstrate the mechanical robustness of the phosphor bronze lead frames has insulated the capacitor from catastrophic electrical failures associated with damage due to CTE mismatch. The mechanical robustness is contrary to expectations based on the CTE of the non-ferrous materials.

The most important advantages of the selection of phosphor bronze for use as a lead frame material lies in the unexpected electrical benefits of lower ESL and ESR properties that these non-ferrous lead frames have over the ferrous based lead frames.

Logic gates in digital circuits from power supplies are constantly switching on and off. At each cycle, current is drawn at a rate proportional to the switching speed. At high switching speeds, the currents interact with the package inductances causing voltage spikes, or noise, in the circuit. As the switching speeds increase, the current also increases thus creating larger voltage spikes. These spikes can cause switching errors in the circuit which will decrease system performance.

The voltage generated in a circuit due to transient current, or inductance, is defined by Equation 2:

$$V = L(di/dt) \qquad \text{Equation 2}$$

where:
V=Voltage, measured in volts;
L=inductance;
di=change in current; and
dt=change in time.

This same relationship is observed with power supplies with fast switching loads. When the load is applied to a power supply, a rush of current will be present in the system to maintain the voltage across the load. Since there are inductances in the system, the inductances impede the current which will cause a voltage drop across the load. Decoupling capacitors are used close to the load to temporarily supply the rush current so that there is no voltage drop across the load. Ideal capacitors can provide an infinite amount of current in the short amount of time but the associated inductances, excluding ESR considerations, will impede the current limiting the effectiveness of the decoupling. Therefore for this application low inductance capacitors are preferred.

To decrease the system noise, capacitors are placed in the circuit for decoupling. Ideally, capacitors have no inductance and effective decoupling can be achieved. Realistically, capacitors have self inductance and can therefore add to the system inductance. It is therefore necessary to choose capacitors with low inductances that do not add to the system noise.

Figure 4:
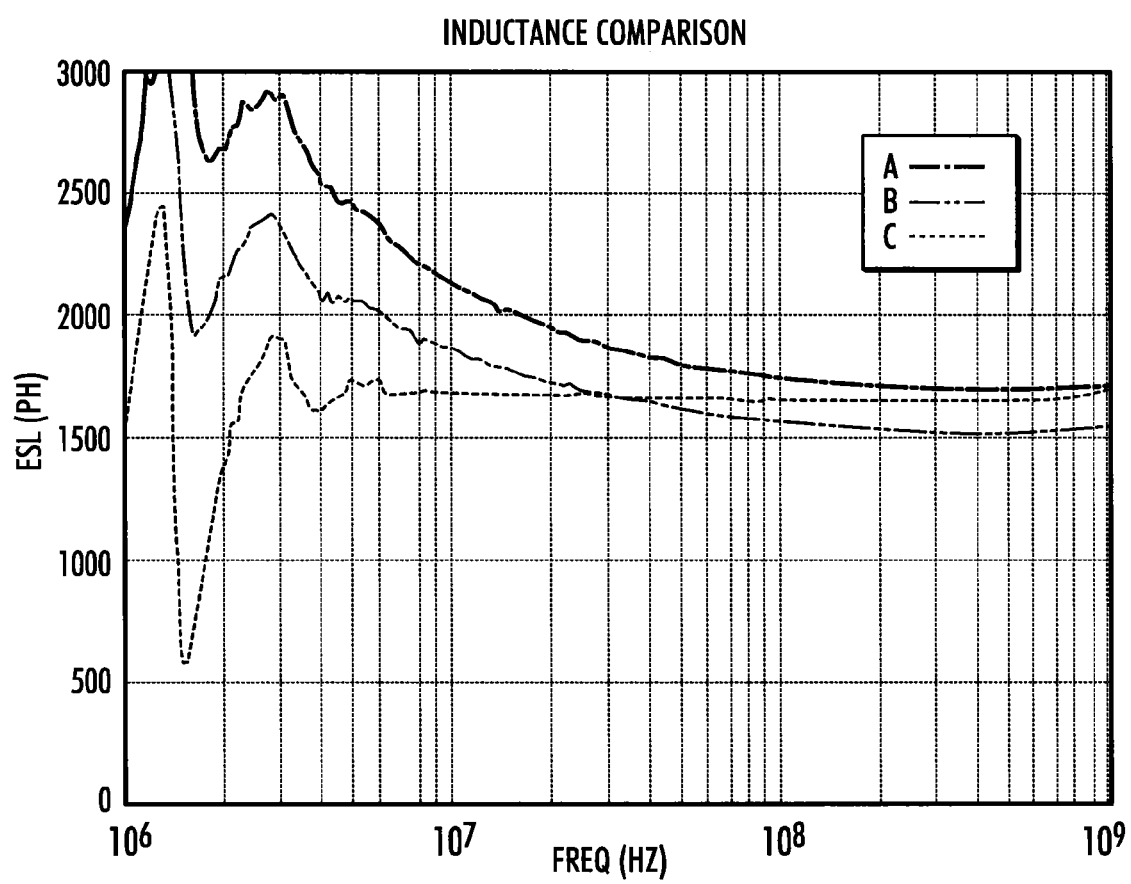
FIG. 4 graphically illustrates ESL results.

The differences in inductance between Alloy 42 and phosphor bronze are illustrated graphically in FIG. 4. Commercially available base metal electrode MLCC's having Alloy 42 leads were purchased and tested and the results compared to the same value Kemet MLCC's having Alloy 42 lead frames and phosphor bronze lead frames. It is clearly demonstrated that ESL is lowered with the use of phosphor bronze lead frames. Also shown are the ESL results of a market available MLCC having an Alloy 42 lead frame (A) and a Kemet capacitor, of the same value and having an Alloy 42 lead frame (B) and a Kemet capacitor, of the same value having Phosphor Bronze lead frame (C).

Another key parameter in capacitors is its Equivalent Series Resistance (ESR). ESR is a measure of all the losses within the capacitor including contributions from all components including electrodes, dielectric, termination and plating. These losses can vary by orders of magnitude depending on material selection and capacitor geometry. ESR is also a function of frequency.

ESR is a source of heat in all electronic devices. Any resistive losses will be dissipated through heat resulting in destruction. Ripple current is not a measure of ESR, but a measure of how the ESR affects the thermal properties of the capacitor. In a ripple current measurement, a signal is supplied to the capacitor with a relatively large AC current.

Power loss in a capacitor is a direct function of the ESR and current as set forth in Equation 3 below.

$$P_{wr}=i^2R \qquad \text{Equation 3}$$

where:
P=power measured in watts;
I=current, measured in amps; and
R=resistance, measured in ohms.
Since the current is squared in the equation, the power loss increases rapidly as current increases. Since the power is dissipated through heat, it is easy to see that increasing the current will cause a rise in heat in the capacitor.

It is therefore desirable that the ESR be as low as possible to reduce heating.

Figure 5:
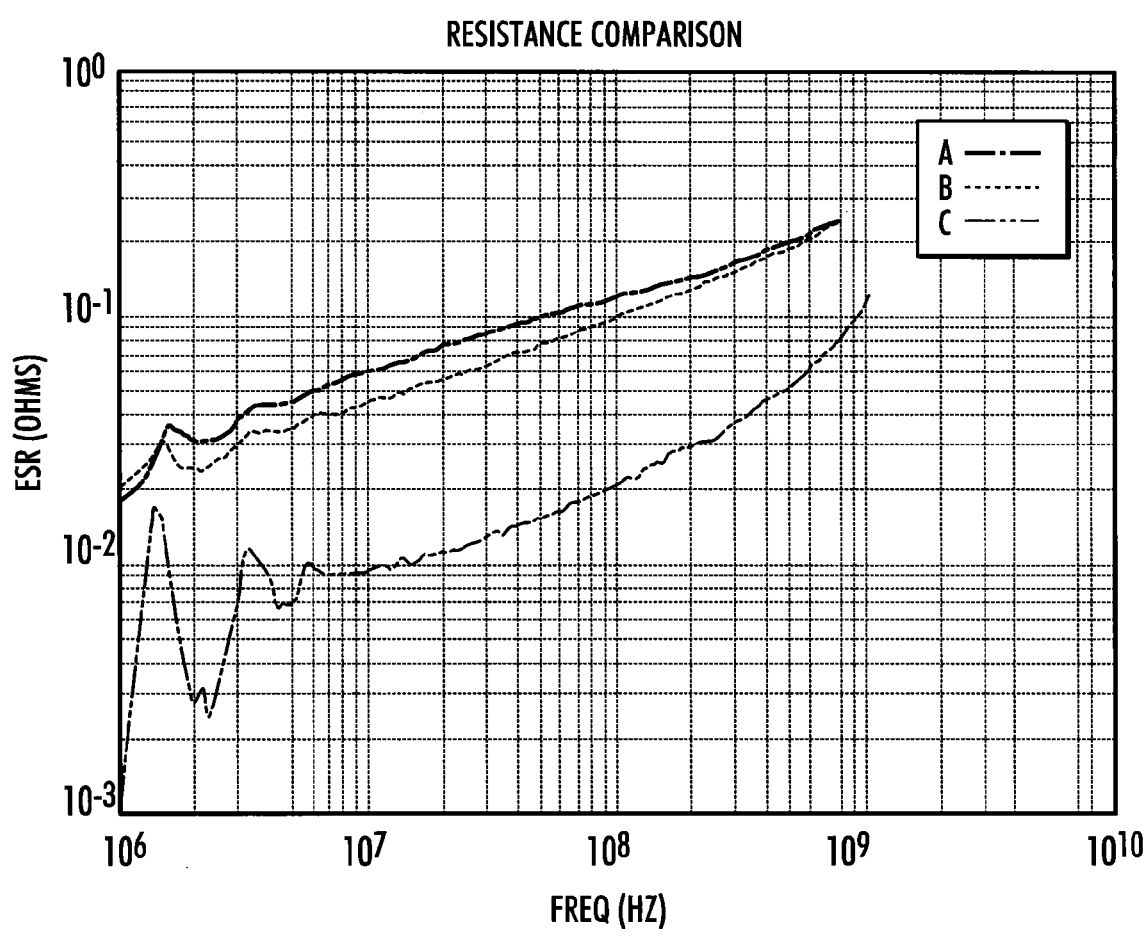
FIG. 5 graphically illustrates ESR results.

The lower resistance of the phosphor bronze lead frame as compared to the Alloy 42 lead frame in a BME capacitor is illustrated graphically in FIG. 5. The ESR test results of a market available MLCC having an Alloy 42 lead frame (A) and a Kemet Capacitor tested with the same Alloy 42 lead frame (B), and a Kemet MLCC with a Phosphor Bronze lead frame (C).

Figure 6:
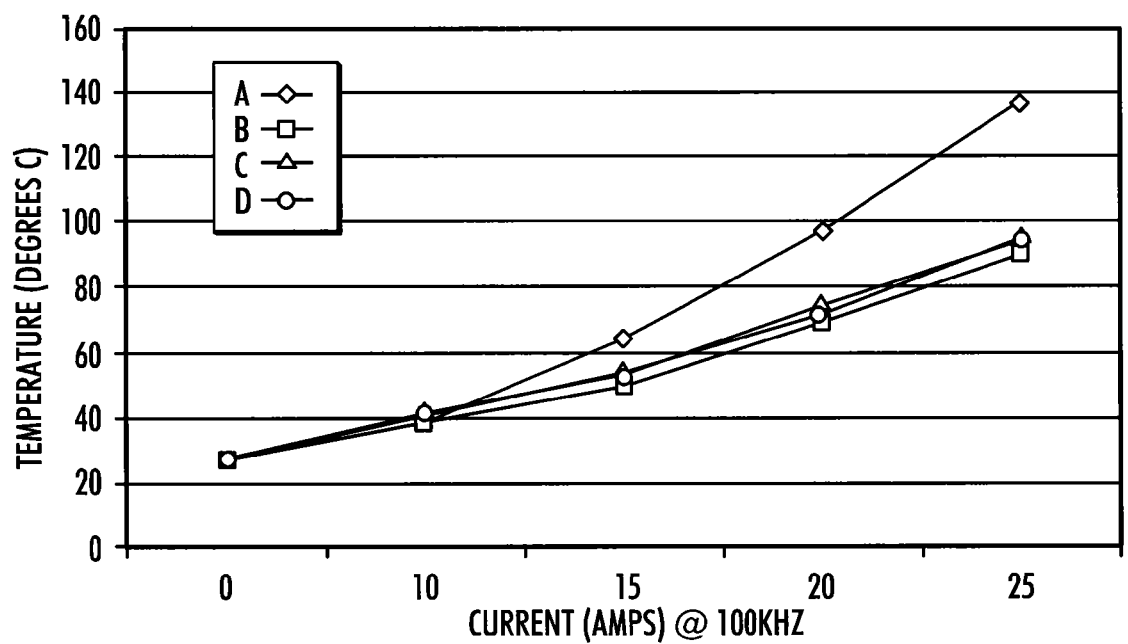
FIG. 6 graphically illustrates temperature results as a function of current.

FIG. 6 shows a plot of the temperature rise of each lead frame type and Table 1 shows the tabulated recorded temperature for each part and each current reading. To demonstrate the effect of these ESL and ESR differences between lead frame materials the ripple current test was conducted on base metal MLCC capacitors having the same capacitance value but having lead frames made from Alloy 42 (A), phosphor bronze (C), Copper 194 (B), and beryllium copper (D). The current was increased from 0 Amps to 10 Amps at 100 kHz where a temperature increase was recorded by a thermocouple on the capacitor. The current was then increased to 25 Amps in 5 amp increments while measuring the temperature rise of each part. The heat dissipated was then calculated using Equation 3 with the results recorded in Table 2. These tests clearly identify the capacitors performance improvements with lower ESL, as shown in FIG. 4, lower ESR, as shown in FIG. 5, and resulting in lower operating temperatures made possible by the use of non ferrous alloys.

FIG. 6 shows the comparative temperature rise of a capacitor as the current load increases with respect to the various lead frame materials used to attach the capacitor to the test board. As expected, the capacitor with Alloy 42 lead frame material shows the highest temperature rise due to the fact that Alloy 42 also showed the highest resistivity as shown in FIG. 5. Phosphor bronze shows a significantly lower temperature rise than Alloy 42 due to lower resistivity. Both the Alloy 194 and beryllium copper (BeCu) alloys have the lowest temperature rise and both have lower resistivity than either the phosphor bronze or Alloy 42.

Figure 8:
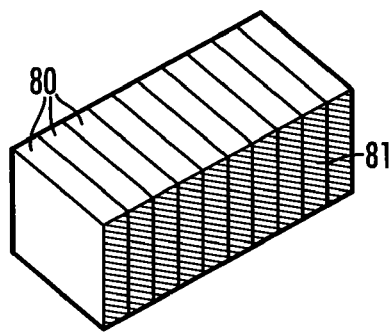
FIG. 8 is a schematic perspective view of a chip stack of the invention.
Figure 9:
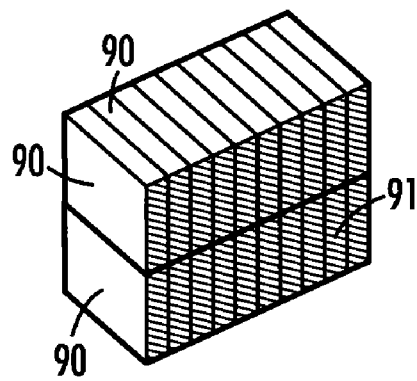
FIG. 9 is a schematic perspective view of a chip stack of the invention.

An embodiment of the invention is set forth in FIG. 8. In FIG. 8, a multiplicity of chips, 80, are arranged such that the internal plates will be parallel. Terminations of common polarity are on a common face, 81. An alternative embodiment is illustrated in FIG. 9 wherein chips, 90, are stacked with some plates parallel to adjacent chips and with plates coplanar to other adjacent chips. Terminations are illustrated as 91. Parts are fixtured and oriented to facilitate assembly.

Figure 10:
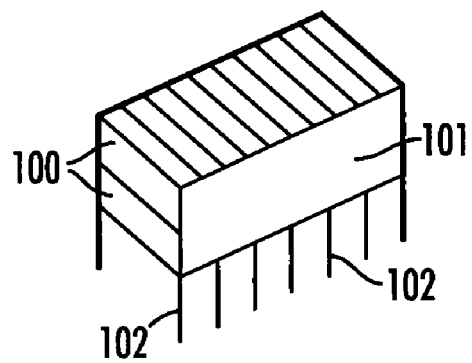
FIG. 10 is a schematic perspective view of an embodiment of the invention demonstrating leaded through hole.

An embodiment of the invention is illustrated in FIG. 10. In FIG. 10, chips, 100, are between lead frames, 101. Attached to the lead frame are through leads, 102, which extend into vias of a circuit board.

Figure 11:
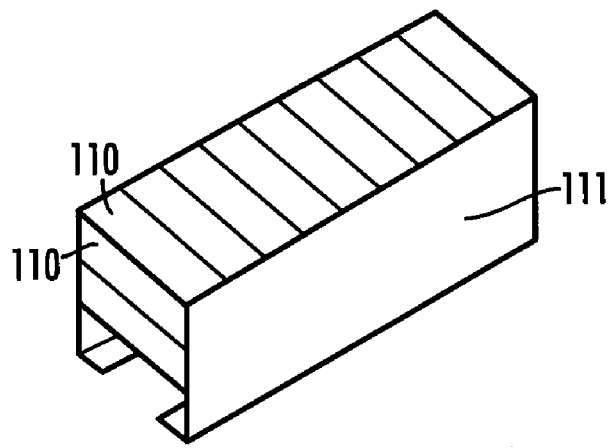
FIG. 11 is a schematic perspective view of an embodiment of the invention demonstrating leaded surface mount.

A preferred embodiment is illustrated in FIG. 11. In FIG. 11 a multiplicity of chips, 110, are stacked between two surface mount lead frames, 111.

Table 1 shows the measured temperature rise per capacitor for each different lead frame alloy and at different current levels. The temperature rise exhibited by the phosphor bronze, Copper 194, and beryllium copper, all non-ferrous alloys, is significantly lower than that of the Alloy 42 which is due to their lower resistivity values than Alloy 42

Table 2 presents calculated power dissipation in watts for each of the capacitors using the power formula Equation 3:

TABLE 1

Temperature Of Capacitors Having Different Lead Frame Materials At Different Applied Current Inputs

| | Temperature (Degrees C.) | | | |
|---|---|---|---|---|
| Current | Alloy 42 | Alloy 194 | Phosphor Bronze | Beryllium Copper |
| 0 | 27 | 27 | 27 | 27 |
| 10 | 39 | 39 | 42 | 41 |
| 15 | 64 | 49 | 54 | 53 |
| 20 | 97 | 69 | 74 | 72 |
| 25 | 137 | 90 | 95 | 94 |

TABLE 2

Calculated Power Dissipation

ESR (mohms) and Watts (W) dissipated at 100 kHz

| Current | Alloy 42 | Alloy 194 | Phosphor Bronze | Beryllium Copper |
|---|---|---|---|---|
| 0 | 0 | 0 | 0 | 0 |
| 10 | 0.346 | 0.172 | 0.194 | 0.2 |
| 15 | 0.7785 | 0.387 | 0.4365 | 0.45 |
| 20 | 1.384 | 0.688 | 0.776 | 0.8 |
| 25 | 2.1625 | 1.075 | 1.2125 | 1.25 |
| ESR | 3.46 | 1.72 | 1.94 | 2.00 |

The invention has been described with reference to the preferred embodiments without limit thereto. One of skill in the art would realize additional embodiments and examples which are not specifically detailed but which are within the scope of the invention as more specifically set forth in the claims attached hereto.

The invention claimed is:

1. A multi-layered ceramic capacitor comprising:
   at least one chip comprising:
      first base metal plates in a parallel spaced apart relationship;
      second base metal plates in a parallel spaced apart relationship wherein said first plates and second plates are interleaved;
      a dielectric between said first base metal plates and said second base metal plates;
      a first termination in electrical contact with said first plates; and
      a second termination in electrical contact with said second plates, wherein a resulting composite of dielectric, plates, first termination and second termination form a multilayer ceramic capacitor having a first coefficient of thermal expansion;
   a first lead frame attached to, and in electrical contact with, said first termination wherein said first lead frame has a second coefficient of thermal expansion wherein said second coefficient of thermal expansion is higher than said first coefficient of thermal expansion; and
   a second lead frame attached to, and in electrical contact with, said second termination wherein said second lead frame has a third coefficient of thermal expansion wherein said third coefficient of thermal expansion is higher than said first coefficient of thermal expansion; and
   wherein at least one of said first lead frame and said second lead frame is a non-ferrous material.

2. The multi-layered ceramic capacitor of claim 1 wherein said non-ferrous material is selected from the group consisting of Cu 194, brass, beryllium copper and phosphor bronze.

3. The multi-layered ceramic capacitor of claim 2 wherein said non-ferrous material is phosphor bronze.

4. The multi-layered ceramic capacitor of claim 3 wherein said phosphor bronze comprises at least 80 wt % copper.

5. The multi-layered ceramic capacitor of claim 4 wherein said phosphor bronze further comprises zinc, tin and phosphor.

6. The multi-layered ceramic capacitor of claim 1 wherein said base metal plate comprises nickel.

7. The multi-layered ceramic capacitor of claim 6 wherein said base metal plate consist essentially of nickel.

8. The multi-layered ceramic capacitor of claim 1 wherein at least one of said second coefficient of thermal expansion and said third coefficient of thermal expansion is higher than said first coefficient of thermal expansion by at least $2 \times 10^{-6}$ µm/m·° C.

9. The multi-layered ceramic capacitor of claim 1 wherein at least one of said second coefficient of thermal expansion and said third coefficient of thermal expansion is higher than said first coefficient of thermal expansion by at least $4 \times 10^{-6}$ µm/m·° C.

10. The multi-layered ceramic capacitor of claim 1 comprising at least a second chip.

11. The multi-layered ceramic capacitor of claim 10 comprising at least two chips to no more than 200 chips.

12. The multi-layered ceramic capacitor of claim 11 comprising no more than 50 chips.

13. The multi-layered ceramic capacitor of claim 10 wherein chips are stacked between said first lead frame and said second lead frame.

14. The multi-layered ceramic capacitor of claim 10 wherein no plates of adjacent chips are coplanar.

15. The multi-layered ceramic capacitor of claim 10 wherein plates of adjacent chips are coplanar.

16. The multi-layered ceramic capacitor of claim 10 wherein at least one chip has an adjacent chip with coplanar plates and an adjacent chip with plates which are not coplanar.

17. The multi-layered ceramic capacitor of claim 10 wherein said chips are in an n×m array wherein n is an integer defining the number of stacked chips and m is an integer defining the number of stacks between said first lead frame and said second lead frame.

18. The multi-layered ceramic capacitor of claim 17 wherein said first lead frame and said second lead frame are separated by no more than one chip.

19. The multi-layered ceramic capacitor of claim 17 wherein said n×m is no more than 200.

20. The multi-layered ceramic capacitor of claim 19 wherein said m is no more than 50.

21. The multi-layered ceramic capacitor of claim 19 wherein said n is no more than 20.

22. The multi-layered ceramic capacitor of claim 1 wherein said first lead frame and said first termination are attached by solder.

23. The multi-layered ceramic capacitor of claim 22 wherein said solder is a lead-free solder.

24. The multi-layered ceramic capacitor of claim 23 wherein said solder comprises 91-92 wt % Sn and 8-9 wt % Sb.

25. The multi-layered ceramic capacitor of claim 1 further comprising at least one through-lead attached to at least one of said first lead frame or said second lead frame.

26. The multi-layered ceramic capacitor of claim 25 wherein said first base metal plates are parallel to said through-lead.

27. The multi-layered ceramic capacitor of claim 25 wherein said first base metal plates are perpendicular to said through-lead.

28. The substrate of claim 27 wherein said first base metal plates are perpendicular to said substrate.

29. A substrate comprising a capacitor of claim 1 mounted thereon.

30. The substrate of claim 29 wherein said first base metal plates are parallel to said substrate.

* * * * *